United States Patent [19]

Inagaki et al.

[11] Patent Number: 5,153,916
[45] Date of Patent: Oct. 6, 1992

[54] METHOD AND APPARATUS FOR DETECTING FOCAL PLANE

[75] Inventors: Akira Inagaki; Masataka Shiba; Yoshihiko Aiba, all of Kanagawa, Japan

[73] Assignee: Hitachi, Ltd., Tokyo, Japan

[21] Appl. No.: 688,285

[22] Filed: Apr. 22, 1991

[30] Foreign Application Priority Data

Apr. 20, 1990 [JP] Japan ................................. 2-102873

[51] Int. Cl.⁵ ............................................. G06K 9/13
[52] U.S. Cl. ............................................. 382/4; 382/54; 382/65
[58] Field of Search ..................... 382/4, 8, 32, 54, 58, 382/65

[56] References Cited

U.S. PATENT DOCUMENTS

| | | | |
|---|---|---|---|
| 3,882,462 | 5/1975 | McMahon | 382/4 |
| 3,891,968 | 6/1975 | McMahon | 382/4 |
| 3,968,476 | 7/1976 | McMahon | 382/65 |
| 4,029,944 | 6/1977 | Trenkamp | 382/65 |
| 4,164,788 | 8/1979 | Jain | 382/54 |
| 4,540,277 | 9/1985 | Mayer et al. | 355/53 |
| 4,711,567 | 12/1987 | Tanimoto | 355/53 |

FOREIGN PATENT DOCUMENTS 58-7136 1/1983 Japan.
61-143760 1/1986 Japan.

*Primary Examiner*—Stephen Brinich
*Attorney, Agent, or Firm*—Antonelli, Terry, Stout & Kraus

[57] ABSTRACT

A method and apparatus measures an image plane of a test pattern projected onto a surface of a sample disposed on a stage to precisely detect the image plane to thereby obtain a precise alignment therebetween for subsequent exposure. The test pattern is provided on a member having a conjugate surface with an upper surface of an illumination detecting unit having at least three optical sensors at different positions thereof and disposed on the stage. The upper surface of the illumination detecting unit has an analogous pattern to the test pattern on each optical sensor and, by moving the stage three dimensionally, outputs of the optical sensors are processed to obtain amounts of light and peak values thereof from which the image plane is obtained.

14 Claims, 6 Drawing Sheets

METHOD AND APPARATUS FOR DETECTING FOCAL PLANE

FIELD OF THE INVENTION

The present invention relates to an optical method and apparatus for exposing a semiconductor, etc., with a micro circuit pattern or for checking such micro circuit pattern and, more particularly, to a method and apparatus for detecting, in exposing a semiconductor wafer with a micro circuit pattern, an image plane of a projecting optical system with high precision, with an improved output.

BACKGROUND OF THE INVENTION

With an increase of integration density of semiconductor device, an exposing device of a projection type among others tends to use shorter wavelength of exposing light from g line (436 nm) to i line (365 nm) and even up to exciter laser light (248 nm). On the other hand, a numerical aperture (NA) of a reducing lens of the exposing device is also increased, causing the focal depth of the lens to be shorter. Therefore, it is necessary to match a semiconductor wafer surface highly precisely with a focal plane of the lens of the projection exposure device.

Figure 9:
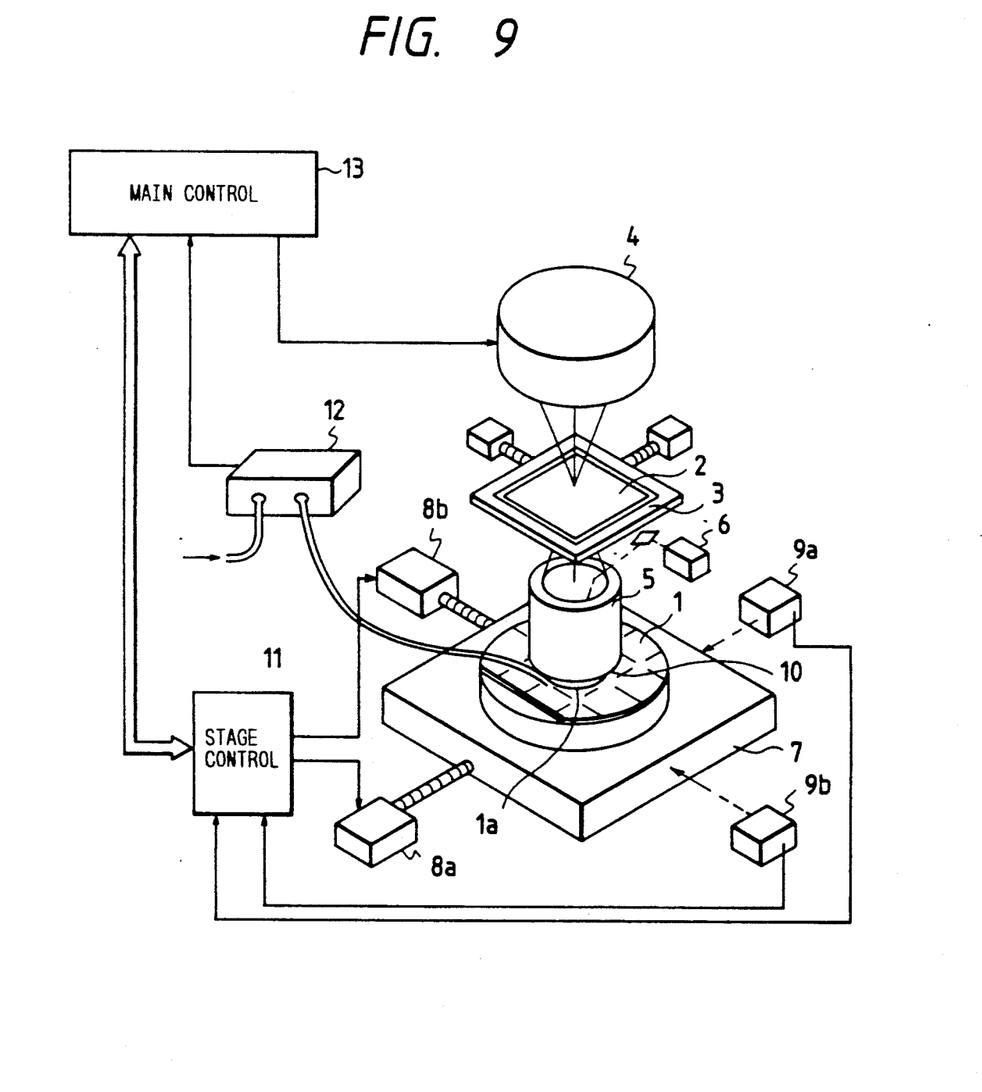
FIG. 9 shows a general construction of a conventional exposing apparatus.

An example of a conventional exposing device is shown in FIG. 9 which includes a semiconductor wafer 1 as a sample material, a circuit pattern drawing mask, 2 a mask stage 3 holding the circuit pattern drawing mask 2 and movable in X and Y directions, an illumination light source 4, a reduction lens 5 supported by a frame (not shown) and arranged between the wafer 1 and the circuit pattern drawing mask 2, and a pattern detector 6 for detecting an alignment pattern 1a provided on the wafer 1. Further, in FIG. 9, a stage 7 has the wafer 1 mounted thereon. The stage 7 is movable three dimensionally in X, Y and Z directions. Motors 8a, 8b drive the stage 7 in X and Y directions, and laser distance meters 9a, 9b measure a position of the stage 7 correspondingly to the motors 8a and 8b, with an air micrometer 10 detecting a position of the upper surface of the wafer 1 in Z direction, i.e., height of the upper surface. A stage position control system 11 controls the motors 8a and 8b and the laser distance meters 9a and 9b, and an air micrometer signal processing system 12 is responsive to an output of the air micrometer 10 representing the height of the upper surface of the wafer 1 to supply it to a main control system 13.

In the projection exposure device constructed as mentioned above, the wafer 1 is mounted on the stage 7 with its upper surface being adjusted to a focal plane of a reduction lens 5. Then, any deviation of an alignment pattern 1a on the wafer 1 with respect to a pattern of a circuit pattern drawing mask 2 which is projected on the upper surface of the wafer 1, which may be caused by a possible deformation of the lens or possible misalignment thereof in an assembly, detected by a pattern detector 6 and the stage is moved by moving the stage 7 by actuating the stage control system 11 such that an amount of the detected deviation becomes zero, completing a positional alignment between the wafer 1 and the circuit pattern drawing mask 2. Thereafter, an exposure is performed by opening a shutter of an illumination source 4.

The positional alignment between an actually focused plane of the reducing lens 5 and the upper surface of the wafer 1 is performed by detecting the height of the upper surface of the wafer 1 by supplying an output of the air micrometer 10 to the micrometer signal processing system 13, moving the stage 7 in Z direction by the stage control system 11. The signal processing system 13 may be constructed as disclosed in, for example, U.S. Pat. No. 4,115,762, assigned to the assignee of this application.

In this system, however, since the focal plane of the reduction lens 5 varies in dependence upon (i) atmospheric pressure and temperature, (ii) temperature variation of a support structure of the reduction lens 5 and (iii) drift of the air micrometer 10, etc., and it is substantially impossible to obtain an exact alignment of the upper surface of the wafer 1 with respect to the actual focal plane of the reduction lens 5 by a single adjustment, it has been usual that a plurality of wafers 1 are exposed as trial and any of these wafers which exhibits a satisfactory exposure is selected to obtain the actual focused position. The height of the upper surface of the wafer 1 is controlled by using an output value of the air micrometer 10 corresponding to the thus obtained actual focal plane as a reference and an actual exposure is performed.

On the other hand, as the exposing device for projecting a desired pattern such as reticle onto an object such as semiconductor wafer, Japanese Kokai (P) 57-212406 discloses a technique for focusing automatically and quickly with high precision, in which a minute light transparent portion is formed in a portion of the pattern to be projected onto the object and the light transparent portion is projected on the object. Reflection from the projected minute portion on the object is focused on a plane of the pattern and passed through the transparent portion. An amount of reflected light passed through the portion is detected.

In the above conventional exposing apparatus, an actual focus position on the wafer 1 is obtained by repeating a test exposure and an actual exposure is performed by controlling the height of the upper surface of the wafer 1 on the basis of an output value of the air micrometer 10 at the thus obtained focused position. Therefore, it takes at least several tens of minutes to perform the repetitive test exposures and thus it is impossible to compensate for drift produced in the apparatus, etc., within a short time in the order of several minutes, resulting in a degraded output due to the test exposures. Further, since the focal depth of the reduction lens 5 becomes smaller than that of the conventional lens, any undulation or bending of the surface of the wafer 1 due to variation of thickness thereof, etc., may produce a tilting of wafer surface with respect to an optical axis within an exposing area thereof. This represents a very important problem. In order to detect such tilting of wafer surface, it becomes popular to not detect an average height of the wafer surface by the air micrometer 10 but measure a height and inclination of the wafer surface within the exposing area thereof by a suitable level meter or tiltmeter. In order to perform an actual exposure, however, it is necessary to set reference values in the level meter, which reference values are values of the height and the inclination. In order to set these reference values, it is necessary to detect height and inclination of an actual focal plane of the reduction lens 5 and to align the wafer 1 or other flat plane to be used as reference to the detected focal plane position.

In the aforementioned Kokai 57-212406, the detection of the amount of reflected light passed through the fine transparent portion is performed by sequentially detecting maximum light amount of respective points on the surface of the wafer to be exposed. That is, this technique does not detect maximum light amounts at a plurality of points simultaneously. Therefore, although it is possible to adjust the surface of the wafer at the optimum focal position, it is impossible previously to detect the height and inclination of the surface within the exposing area thereof and thus it is impossible to precisely obtain a focussed flat plane.

SUMMARY OF THE INVENTION

An object of the present invention is to provide a focused flat plane detection method and apparatus therefor which is particularly suitable to use in an exposing apparatus for exposing a micro circuit pattern of, for example, a semiconductor and by which a focused flat plane of a projecting optical system can be detected precisely, thereby resulting in an improved output.

In order to achieve the above object, the method according to the present invention comprises the steps of disposing an illumination detecting unit having at least three separately arranged optical sensors on a stage on which a sample to be exposed is to be mounted, providing a test pattern including one or more linear or rectangular stripes on each of the optical sensors of the illumination detecting unit and on a conjugate surface of a member having a pattern to be projected with a plane including the upper surface of the illumination detecting unit through a lens of a projecting optical system, projecting the test pattern of the member onto the test patterns on the upper surface of the optical sensors of the illumination detecting unit, measuring light amounts of the projected test patterns on the illumination detecting unit by the optical sensors by moving the stage two dimensionally and concurrently detecting peak values thereof by vertically moving the stage, detecting a focused plane of the lens according to the peak values, and obtaining an image plane of the focused plane thus detected.

The illumination detecting unit may be constructed with a package provided with at least three optical sensors or elements and a glass plate having at least three portions on each of which one or more linear or rectangular shaped patterns are provided. The glass plate is attached onto the package with the optical elements corresponding to the patterns of the portions in position. Alternatively, the illumination detecting unit may be construction as a two dimensional optical sensor such as a photo multiplier or CCD camera.

The apparatus for testing an exposure or exposing a sample surface with a pattern provided on a member, according to the present invention, includes a stage on which a sample to be exposed is to be mounted and a stage controlling portion for moving the stage three dimensionally in X, Y and Z directions. The apparatus comprises an illumination detecting unit provided on the stage and includes at least three optical sensors each associated with a test pattern including one or more linear or rectangular shaped patterns thereabove, a member having a conjugate plane with the upper surface of the illumination detecting unit with respect to a reduction lens of a projecting optical system. The conjugate plane having a test pattern analogous to the pattern of each optical sensor of the illumination detecting unit. The projecting optical system projects the test pattern of the member onto each of the test patterns provided on the upper surface of the illumination detecting unit through a lens, and a signal processing system measures light amounts of the projected test on each of the test patterns of the illumination detecting unit and concurrently measures peak values thereof while vertically moving the stage. The signal processing to be performed by the signal processing system may be of the type disclosed in, for example, U.S. Pat. No. 4,115,762 with some modification which may be made easily by those skilled in the art.

The illumination detecting unit may be constructed with a package provided with at least three optical elements and a glass plate having at least three portions on each of which one or more linear or rectangular patterns are provided. The glass plate is attached onto the package with the optical elements corresponding to the patterns of the portions in position. Alternatively, the illumination detecting units may be construction as a two dimensional optical sensor, as mentioned previously.

With the construction of the present invention mentioned above, it is possible to detect light amounts and peak values thereof at at least three points on the stage simultaneously. Therefore, it is possible to detect the focused plane, i.e., an image plane, precisely within a very short time.

By making the upper surface of the illumination detecting unit consistent with the focused plane and measuring height and inclination of the upper surface of the illumination detecting unit by a level meter, it is possible to obtain reference values of the latter. An exposure can be accomplished by making a surface of an exposing area of the sample, i.e., semiconductor wafer, consistent with a plane determined by these reference values by moving the stage. Further, with use of the test pattern including the group of linear or rectangular patterns, it is possible to detect, in more detail, undulation or bending of the image plane and thus it is possible to evaluate the characteristics of the projecting optical system. With the use of the illumination detecting unit constructed with the package provided with at least three optical elements and the glass plate having at least three portions on each of which one or more linear or rectangular patterns are provided and attached onto the package with the optical elements corresponding to the patterns of the portions in position, it is possible to make the illumination detecting unit compact and to be able to easily be attached to any conventional exposing apparatus.

When the illumination detecting units is constructed as a two dimensional optical sensor, the patterns provided on the illumination detecting units may be omitted.

DETAILED DESCRIPTION OF THE PREFERRED EMBODIMENTS

A first embodiment of the present invention will be described with reference to FIGS. 1 to 5 in which same reference numerals as those used in FIG. 9 depict same components, respectively.

Figure 1:
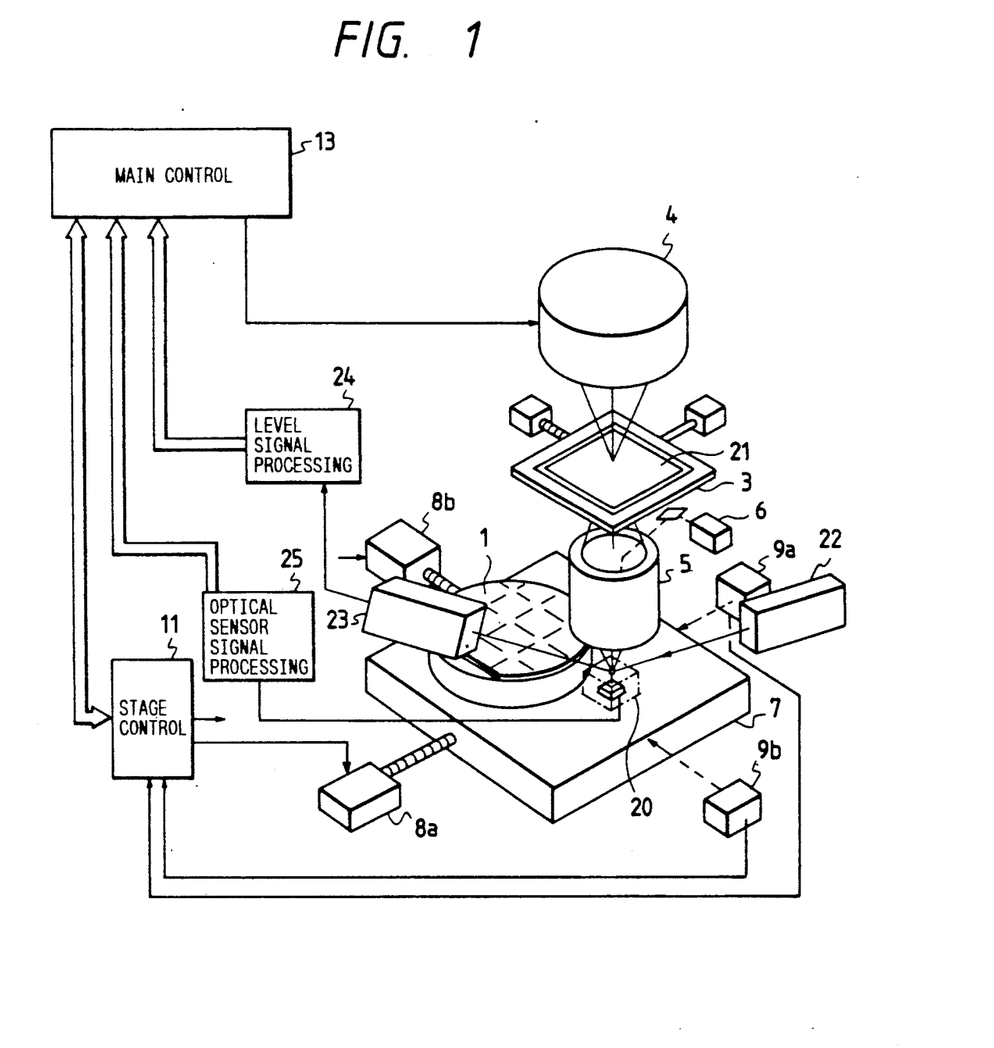
FIG. 1 shows a general construction of an image plane detecting apparatus according to an embodiment of the present invention.
Figure 4:
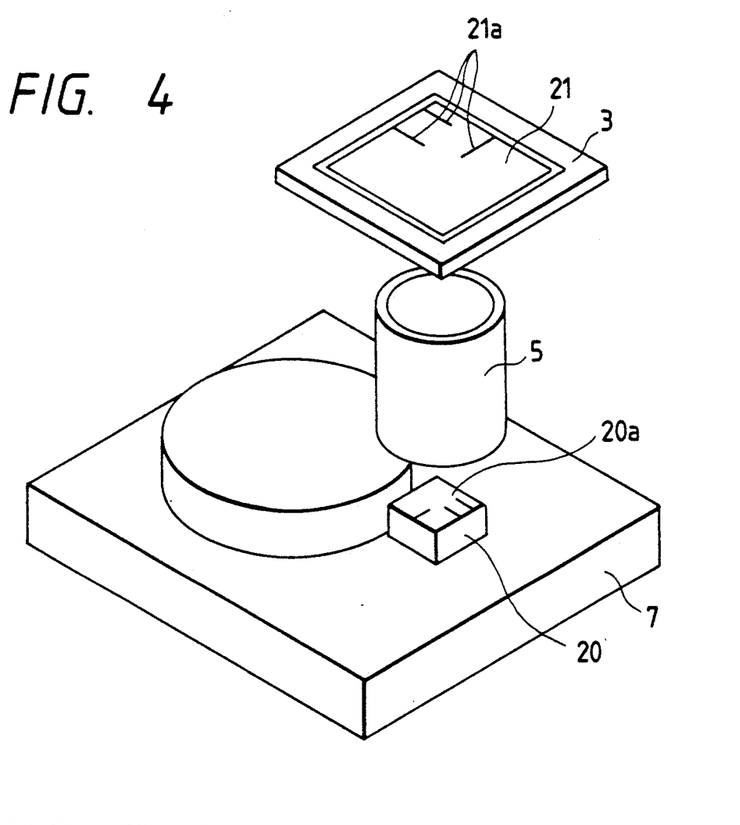
FIG. 4 is a perspective view of an example of patterns provided on a circuit pattern drawing mask and an illumination detecting unit.

In FIG. 1, a wafer 1 is attractively mounted on a chuck. A stage 7 is constituted with an X-Y stage portion, a Z stage portion and a tilt stage portion. A focal plane detecting unit 20 to be mounted on the stage 7 includes an upper surface portion formed at different positions thereon with at least three, first detection patterns 20a each in the form of a single or plural transparent linear or rectangular stripe and a corresponding number of photosensors arranged correspondingly in position to the first detection patterns 20a on a rear surface of the upper surface portion, as shown in FIG. 4. The focal plane detection unit 20 and the chuck are mounted on the stage 7 such that ah eight of a light receiving plane of these photo-sensors of the focal plane detection unit 20, measured from an upper surface of the stage 7, is consistent with an average height of an upper surface of the wafer on the stage. An X drive source 8a drives the X stage portion, and a Y drive source 8b drives the Y stage portion. Although not shown, a Z drive source and A tilt drive source are also provided for finely driving the Z stage portion vertically and for tilting the tilt stage portion. In this connection, a Z axis deviation detector for precisely detecting any vertical deviation of the Z stage and a tilt detector for precisely detecting a tilting of the tilt shape portion are also provided. An X axis laser distance meter 9a measures a deviation of the X stage portion and a Y axis laser distance meter 9b measures a deviation of the Y stage portion. A mask stage 3 is adapted to mount a mask 21 such that the latter is aligned with a reference position of a reduction projection system. An exposing optical system 4 includes an illumination light source, a shutter and a condenser lens, etc. A reduction lens 5 projects a reduced image of a circuit pattern provided on the mask 21 on an exposure area on the wafer 1 and a detector 6 detects an alignment pattern provided on the wafer 1. A level meter for detecting height and tilting of the exposing area of the wafer and height and tilting of the upper surface of the focal plane detection unit 20 may include with two detection sets each including a light emitter 22 and a light receiver 23, as disclosed in PCT application Ser. No. 702643/90 (filed on Apr. 20, 1990).

The mask 21 is formed, at least at three positions on a peripheral portion of the circuit pattern thereon corresponding to the respective positions of the first detection patterns 20a, with second detection patterns 21a each including a single or plural opaque lines or rectangular stripes such that the second detection patterns, when projected through the reduction lens 5 may be consistent with the first detection patterns on the focal plane detection unit 20.

Figure 5A:
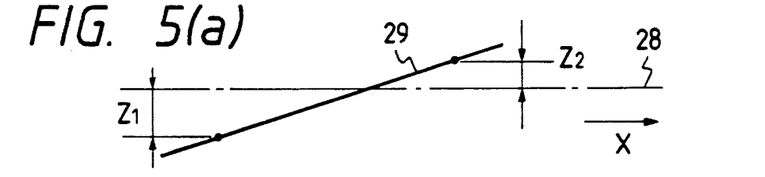
FIG. 5(a) provides an illustration for obtaining an image plane from a plurality of focal positions on the plane.

A stage control system 11 supplies a main control system 13 with an X stage deviation measured by the X axis laser distance meter 9a, a deviation of the Y stage portion measured by the Y axis laser distance meter 9b, a deviation of the Z stage portion measured y the Z axis deviation detector and a tilting of the tilt stage portion measured by the titling detector and controls the X-Y stage portion, the Z stage portion and the tilt stage portion, respectively. according to instructions supplied from the main control system 13. A signal processing system 24 processes outputs of the level meter. That is, the signal processing system 24 responds to detection signals from the light receivers 23 of the level meter to detect height and tilting of the surface of the wafer in its exposition area, precisely, with reference to the reference plane of the apparatus shown in FIG. 5. An example of the signal processing system 24 is disclosed in the aforementioned PCT application Ser. No 702643/90. A signal processing system 25 processes signals from the focal plane detection unit 20. That is, the signal processing system 25 serves to convert image signals detected by the respective photo-sensors provided in the focal plane detection unit 20 into digital signals.

The main control system 13 supplies a drive signal to the shutter of the projection exposure system. Further, in order to obtain an actual focal plane (29 in FIG. 5) of the reduction lens 5 for the pattern formed on the mask, the main control system 13 responds to the various signals from the control system 11. That is, the main control system 13 sends an instruction signal to the control system 11 causing the latter to align a center of the focal plane detection unit 20 with an optical axis of the reduction lens 5 by moving the X and Y stage portions. The main control system 13 calculates a deviation between the first detection patterns 20a and the second detection patterns 21a on the basis of the digital image signals from the signal processing system 25 and sends an instruction to the control system 11 for further moving the respective X and Y stage portions such that the deviation calculated becomes null. Then it sends an instruction to the stage control system 11 instructing vertical fine movement of the Z stage portion while the X and Y stage portions are held stationarily, then calculates, on the basis of a precise deviation of the Z stage portion indicated by peak values M1, M2 and M3 of the detected digital signals from the signal processing system 25, focal point positions Z1, Z2 and Z3. Then, it calculates, on the basis of the calculated positions Z1, Z2 and Z3 and coordinates (X1, Y1), (X2, Y2), (X3, Y3) of the photo-sensors of the focal plane detection unit 20, the focal plane 29 with respect to the reference plane 28 of the apparatus, and sends an instruction to the control system 11 instructing driving the Z stage portion and the tilt stage portion such that the plane including light receiving planes of the respective sensors of the focal plane detection unit 20 becomes consistent with the calculated focal plane 29. Thereafter, height and tilting of the upper surface of the focal plane detection unit 20 are measured by the level meter. The main control system 13 calculates height and tilting of the upper surface of the unit 20 on the basis of the output signals from the signal processing system 24 and determines them as reference values for measurement of height and tilting of every exposure area of wafer by means of the level meter prior to an actual exposure of wafer. Practically, however, it is necessary to compensate for a thickness or distance between the upper plane of the focal plane detection unit 20 and the plane including the light receiving planes of the respective photo-sensors. Such compensation is easy for those skilled in the art.

Upon the instruction from the main control system 13, the stage control system 11 drives the X and Y stage portions in X and Y directions to make the center of the focal plane detection unit 20 consistent with the optical axis of the reduction lens 5. Then, upon another instruction from the main control system 13, the shutter of the illumination system 4 is opened to project the second detection patterns 21a formed in the peripheral portion of the mask 21 through the reduction lens 5. Thus, a focal plane is formed on the upper surface of the focal plane detection unit 20 under the same conditions as those in an actual exposure regardless of minute variation of relative positions of the mask 21 and the reduction lens 5 and/or variation of power of the reduction lens due to aging or temperature variation, etc.

Figure 2A:
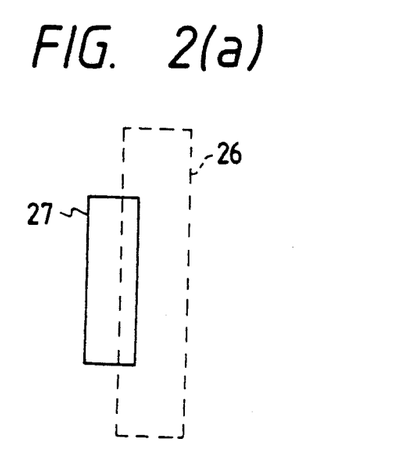
FIG. 2A illustrates a deviation of patterns.
Figure 2B:
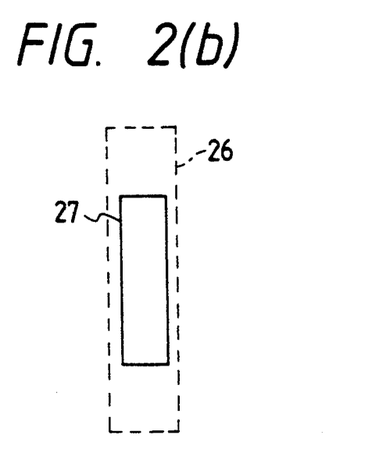
FIG. 2B illustrates a pattern coincidence.

In this case and with the opaque patterns 21a being lines, a slit image 26 formed by projection of the second opaque patterns 21a on the upper surface of the focal plane detection unit 20 with predetermined reduction rate and a transparent line pattern 27 formed by the first patterns 20a on the upper surface of the unit 20 are usually not consistent with each other as shown in FIG. 2a. Therefore, the main control system 13 calculates the deviation between them on the basis of the image signals from the respective photo-sensors of the unit 20 and sends the instruction to the stage control system 11 instructing the latter to finely drive the X and Y stage portions stage 7 such that such deviation disappears, resulting in a consistency therebetween as shown in FIG. 2b.

Figure 3:
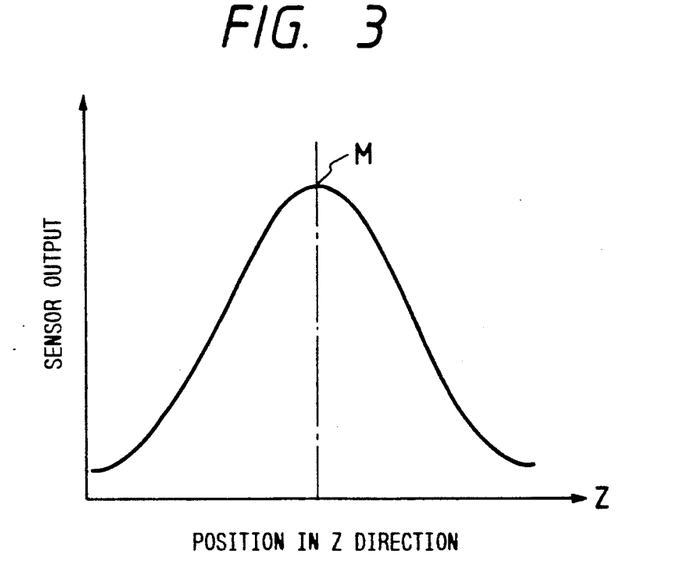
FIG. 3 is a graph showing a relationship between an output of an optical sensor and position in a Z direction.

Then, the main control system 13 sends an instruction to the control system 11 instructing the latter to finely drive the Z stage portion vertically with the X and Y stage portions being kept stationarily, while taking images of the second patterns 21a obtained from the first detection patterns 20a of the unit 20 through the signal processing system 25 in. A relationship between the Z position obtained through the table control system 11 and the output value of the signals detected by the photo sensors of the unit 20 is indicated by a upwardly convex curve as shown in FIG. 3 and therefore peak points M can be detected easily. The position in the Z direction which indicates the peak becomes the focal position of the second detection pattern formed on the mask 21 projected through the reduction lens 5 at the position (X, Y) at which the sensor is disposed.

That is, the main control system 13 calculates, on the basis of a precise deviation of the Z stage portion indicated by peak values M1, M2 and M3 of the detected digital signals (shown in FIG. 5b) from the signal processing system 25, focal point positions Z1, Z2 and Z3 and, on the basis of the calculated positions Z1, Z2 and Z3 and the coordinates (X1, Y1), (X2, Y2), (X3, Y3) of the photo-sensors of the focal plane detection unit 20, the focal plane 29 with respect to the reference plane 28 of the apparatus. Then, the main control system 13 sends an instruction to the control system 11 instructing driving the Z stage portion and the tilt stage portion such that the plane including light receiving planes of the respective sensors of the focal plane detection unit 20 becomes consistent with the calculated focal plane 29.

In this case, it may be possible to confirm the consistency therebetween by calculating the focal plane in the same manner as that used in the calculation of the focal plane 29 and comparing them.

Thereafter, height and tilting of the upper surface of the focal plane detection unit 20 are measured by the level meter. The main control system 13 calculates height and tilting of the upper surface of the unit 20 on the basis of the output signals from the signal processing system 24 and determines them as reference values for measurement of height and tilting of every exposure area of wafer by the level meter prior to an actual exposure of wafer. Practically, however, it is necessary to compensate for a thickness or distance between the upper plane of the focal plane detection unit 20 and the plane including the light receiving planes of the respective photo-sensors.

As mentioned, the reference plane (focal plane of the wafer surface) to which the output signal of the level meter should be referenced in an actual exposure is obtained.

It should be noted that dimension of the second detection pattern 21a formed on the mask 21 may be smaller than dimension of circuit pattern (1 μm or smaller).

Then, the main control system 13 supplies an instruction signal to the control system 11 to step and repeat the X and Y stage portions for an actual exposure, to measure height and tilting of every exposure area of the wafer 1 by the level meter and the signal processing system thereof and by making the measured heights and tiltings consistent with the reference values obtained as mentioned above, the exposure areas of the wafer are consistent with the actual focal plane of the reduction lens for the circuit pattern formed on the mask. Therefore, it becomes possible to print a highly fine circuit pattern on the wafer even if wavelength of light used is as short as i line or even up to exciter laser light and/or even if the focal depth of the reduction lens becomes smaller.

That is, according to the present invention, it is possible to precisely correct focusing drift of the reduction projection exposure system and shorten a time necessary to perform such correction. As a result, it is unnecessary to perform the test exposure as otherwise necessary even in a reduction projection exposure apparatus whose focal depth margin is very small due to a use of very short wavelength of exposing light, resulting in an improved throughput.

Figure 5B:
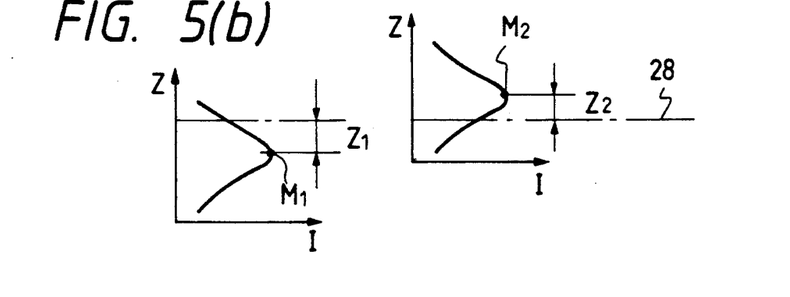
FIG. 5(b) is an illustration of a deviation of a peak output value of an optical sensor with respect to the reference plane of the apparatus.

FIG. 4 shows an arrangement by which the focus detections at three points are performed simultaneously. As shown, a circuit pattern drawing mask 21 is provided with three identical line patterns 21a and a corresponding pattern including three line patterns 20a is provided on the illumination detecting unit 20. In this case, three optical sensors are arranged on the illumination detecting unit 20 correspondingly in position to the patterns 21a. At each of the three positions of the optical sensors, the same procedures as those shown in FIG. 3 are performed as shown in FIG. 5b to obtain points M1, M2 and M3 at which the maximum output values are obtained (in FIG. 4, only M1 and M2 are indicated) and, thus, it becomes possible to detect three actually focused positions within a very short time, to obtain deviations Z1 and Z2 of the detected points M1 and M2 from a line 28 indicating the reference plane of the apparatus, to obtain precisely a plane containing the Z1 position and the Z2 position, that is, an actual image plane 29, as shown in FIG. 5a, and, thus, to make a transfer of highly fine circuit pattern possible. At the same time, since it is possible to correct a focusing drift precisely within a reduced time and to eliminate the conventional test exposing, the throughput can be improved.

Figure 6A:
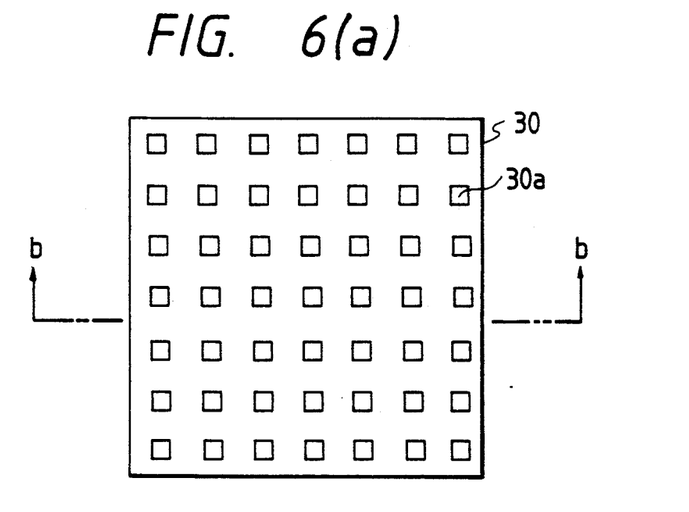
FIG. 6(a) is a schematic example of an illumination detecting unit having a plurality (n×n) patterns.
Figure 6B:
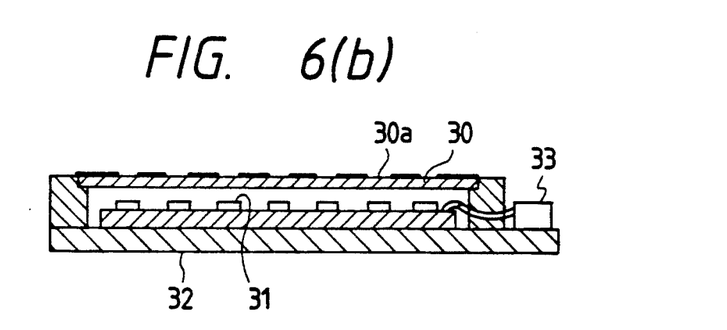
FIG. 6(b) is a cross-sectional view taken along the line B—B in FIG. 6(a)

FIG. 6(a) and 6(b) show a second embodiment of the illumination detecting unit of the present invention, in which a patterned glass plate is attached onto a package in which a plurality of optical elements are provided. The patterned glass plate 30 has a plurality (n×n, where n is an integer equal to or larger than 2) of rectangular patterns 30a as shown in FIG. 6a and is concurrently used as a protective glass plate for the optical sensors. FIG. 6b is a cross section taken along a shows the optical sensors 31 positioned correspondingly to the patterns 30a and the package 32 for supporting the optical sensors 31, with the patterned glass plate 30 being directly bonded to the package 32. A reference numeral 33 indicates a connector.

On the other hand, a mask having a pattern analogous to the pattern 30a of the glass plate 30 is used instead of the circuit pattern drawing mask 21 used in the first embodiment. The pattern 30a may be a linear shaped pattern. Other constructive components than those mentioned above are the same as those used in the first embodiment.

Since, with this construction, the focusing positions can be detected at the n×n points and thus the detections of the height and inclination of the image plane can be detected more precisely, any undulation or bending of the image plane can be determined more precisely, so that it is possible to obtain the image plane 29 more precisely.

A third embodiment of the present invention is similar in construction to that of the first embodiment except that a two-dimensional optical sensor such as CCD is used instead of the illumination detecting unit 20 and a mask such as reticle having a plurality (n×n, where n is an integer equal to or lager than 2) of linear-shaped or rectangular-shaped patterns 30a similar to those used in the second embodiment is used instead of the circuit pattern drawing mask 21.

In this embodiment, the linear or rectangular-shaped patterns provided on the illumination detecting unit 20 is unnecessary, resulting in a simpler construction.

Figure 7:
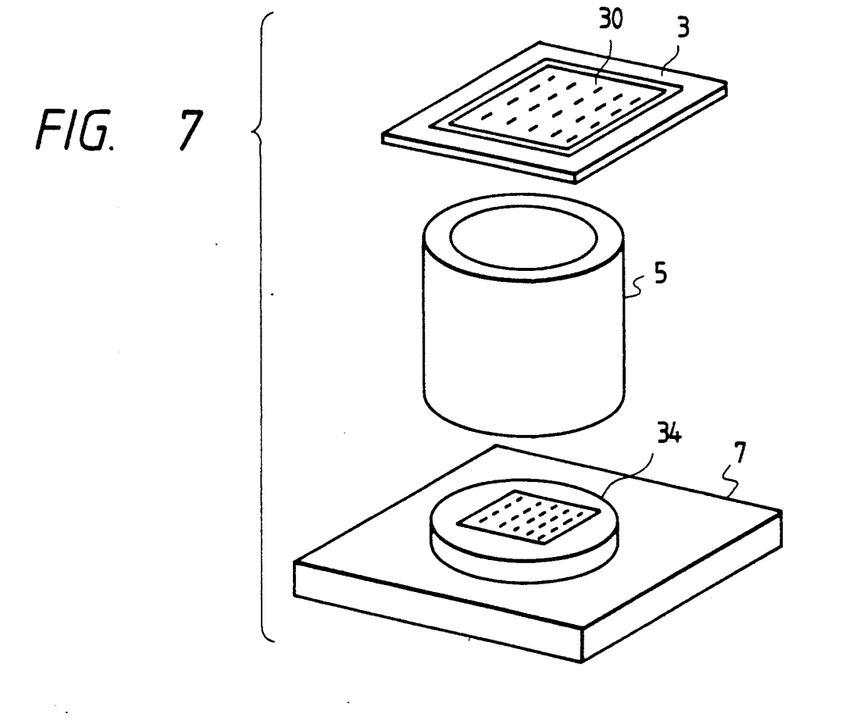
FIG. 7 is an exploded view of another embodiment of an illumination detecting unit in which an optical sensor is incorporated in a jig similarly configured to a wafer chuck.

FIG. 7 shows a fourth embodiment of the present invention, in which optical sensors of an illumination detecting unit and a mask having such linear or rectangular-shaped patterns as those in the previous embodiments are incorporated in a jig configured correspondingly to a wafer chuck. In FIG. 7, the jig 34 for measuring an image plane has the same configuration as that of the wafer chuck, in which the mask and the optical sensors arranged correspondingly in position to the patterns of the mask are incorporated.

In this embodiment, since the jig 34 functions in a similar manner to the illumination detecting unit 20, it is possible to mount it easily on any conventional apparatus without necessity of adjustments which are required when the illumination detecting unit 20 is used. Further, it is possible to measure characteristics of the projecting system itself. In this case, an actual focus position of the reduction lens 5 is detected by the jig 34 and thus it is possible to obtain the image plane 29 precisely.

Figure 8:
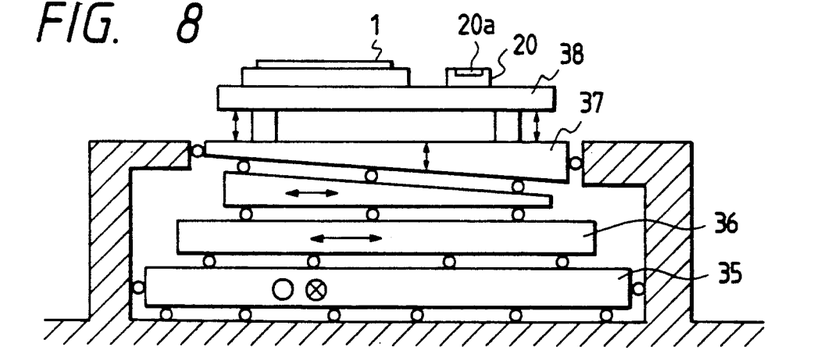
FIG. 8 is a schematic view of a relationship between the illumination detecting unit and a stage on which a unit is mounted.

In FIG. 8, a Y stage 35 moves a wafer 1 and an illumination detecting unit 20 which are mounted thereon in Y direction and an X stage 36 moves these elements in X direction. A Z stage 37 is used to move them in Z direction. A tilt stage 38 is used to tilting them by desired angle and in desired direction. With these stages, the reference value of the level meter constituted with the pair of the light emitter 22 and the light receiver 23 shown in FIG. 1 can be obtained. That is, the X stage 36, the Y stage 35 and the Z stage 37 are driven suitably and then the tilt stage 38 is driven such that the pattern 20a on the illumination detecting unit 20 comes into coincidence with the detected focus plane (image plane) of the reduction lens 5. At a time when the coincidence is obtained, the height and tilting of the upper surface of the pattern 20a are measured by the level meter, resulting in the reference values.

As mentioned hereinbefore, according to the present invention, it is possible to measure at least three focus positions simultaneously to thereby obtain an image plane of the lens of the projecting optical system precisely. Further, by detecting the focus position directly by the optical sensors of the illumination detecting unit, it is possible to detect the image plane within a very short time, improving the throughput. In addition, since the tilting or inclination of the plane to be measured can be detected, it is possible to obtain the reference values of the level meter, as mentioned previously.

What is claimed is:

1. A method of detecting an image plane, the method comprising the steps of:
   optically detecting an illumination of a sample by a detecting unit having at least three optical sensors at different positions thereof on a stage on which the sample is to be mounted;
   projecting test patterns each including one or more linear or rectangular shaped patterns on said optical sensors of said illumination detecting unit, respectively, and a test pattern analogous to said test patterns on said optical sensors on a conjugate surface of a member with an upper surface of said illumination detecting unit through a lens of a projecting optical system; 'projecting said test pattern of said member onto said test patterns on said upper surface of said optical sensors of said illumination detecting unit;
   measuring light amounts of the projected test patterns of said illumination detecting unit by said optical sensors and concurrently detecting peak values thereof moving said stage vertically; and
   detecting a focused plane of said lens according to the peak values and obtaining an image plane of said focused plane thus detected.

2. The method claimed in claim 1, further comprising the step of covering said optical sensors by a glass plate having at least three portions on which said patterns of said optical sensors are respectively provided.

3. The method claimed in claim 1, wherein said step of optically detecting includes two dimensional optical sensing.

4. The method claimed in claim 3, wherein said two dimensional optical sensing includes utilizing a CCD camera.

5. An apparatus for testing an exposure or exposing a sample surface with a pattern provided on a member, comprising:

a stage on which a sample to be exposed is to be mounted;

a stage controlling portion for moving said stage three dimensionally in X, Y and Z directions;

an illumination detecting unit provided on said stage and including at least three optical sensors each associated with one or more line or rectangular shaped patterns thereabove;

a number having a conjugate plane with an upper surface of said illumination detecting unit with respect to a reducing lens of a projecting optical system, said conjugate plane having a test pattern analogous to the patterns of said optical sensor of said illumination detecting unit;

a projecting optical system for projecting the test pattern of said member onto said test patterns provided on said upper surface of said illumination detecting unit through said reducing lens; and a signal processing system for measuring light amounts of the projected test pattern on said test patterns of said illumination detecting unit and concurrently measuring peak values thereof while vertically moving said stage.

6. The apparatus claimed in claim 5, wherein said illumination detecting unit comprises a package provided with said optical sensors and a glass plate arranged to cover said optical sensors, said glass plate having at least three portions on which said patterns of said optical sensors are provided, respectively, correspondingly in position.

7. The apparatus claimed in claim 5, wherein said illumination detecting units comprises a two dimensional optical sensor.

8. The apparatus claimed in claim 7, wherein said two dimensional optical sensor is a CCD camera.

9. A method for detecting an image plane, the method comprising the steps of:

disposing an image plane measuring jig configured to a wafer chuck and incorporating a plurality of optical sensors and a mask having a plurality of linear or rectangular shaped patterns in an image plane measuring jig configured to a wafer chuck with each pattern being projected on a different one of said sensors on a stage on which a sample is mounted;

projecting a test pattern analogous to said patterns of said mask on a conjugate surface of a member with an upper surface of said mask through a reducing lens of a projecting optical system; 'projecting said test pattern of said member onto said test patterns on said upper surface of said mask in said jig;

measuring light amounts of the projected test patterns on said mask in said jig by said optical sensors of said jig and concurrently detecting peak values thereof while vertically moving said stage; and detecting a focused plane of said lens according to the peak values and obtaining an image plane of said focused plane thus detected.

10. An apparatus for detecting an image plane, comprising:

a stage for mounting a sample wafer;

a stage controlling system for moving said stage in X,Y and Z directions;

an image plane measuring jig fixedly mounted on said stage, said jig being configured to a wafer chuck and incorporating therein a plurality of optical sensors and a mask disposed on said optical sensors and having a plurality of line or rectangular shaped patterns each on a different one of said sensors on a stage on which a sample is mounted;

a member having a surface conjugate with a surface of said mask through a reducing lens and having an analogous test pattern to said patterns of said mask;

an optical projecting system including said reducing lens for projecting said test pattern of said member onto said test patterns on said upper surface of said mask in said jig through said reducing lens; and a signal processing system for measuring light amounts of the projected test patterns on said mask in said jig by said optical sensors in said jig and concurrently detecting peak values thereof while vertically moving said stage by said stage controlling system.

11. A reducing exposure apparatus comprising:

a stage adapted for mounting a substrate;

a reduction projection lens for projecting a circuit pattern on a mask onto an exposure area on said substrate;

stage control means for regulating a position of said stage by moving said stage in a Z direction and parallel to an optical axis of said reduction projection lens and in a X, Y plane vertical to said optical axis of said projection lens and a tilting of said stage by rotating the stage about the X and Y axes to focus said circuit pattern on said exposure area of said substrate, said substrate being exposed with an image of said circuit pattern of said mask after said image is focused on said exposure area, said mask has at least three first patterns, each of said first patterns including at least one of a linear or rectangular shape;

height and tilting measuring means for measuring height an inclination of a plane of said exposure area of said substrate;

focus plane calculation means including an illumination detecting unit disposed on a portion of said stage outside of said substrate and comprising at least three optical sensors arranged at different positions on an upper surface thereof and having at least three second patterns analogous to and respectively corresponding in position to said first patterns, for detecting, through said second pattern, said first patterns of said mask reduced thereon by said reduction projection lens while moving said stage in a Z direction after said illumination detecting unit is positioned nominally on said exposure area in the X, Y plane, to obtain detection signals, said focus plane calculation means being responsive to distances of said stage in the Z direction when said detection signals from said optical sensors indicate peak values M1, M2 and M3 to calculate focus positions Z1, Z2 and Z3, respectively, and responsive to coordinates (X1, Y1), (X2, Y2) and (X3, Y3) of said optical sensors in the X, Y plane and thus calculated focus positions Z1, Z2 and Z3 to calculate a position and tilting of the focus plane of said reduction projection lens; and reference position correcting means for positioning said illumination detecting unit in said focus plane calculated by said focus plane calculation means, measuring a height and tilting of said illumination detecting unit thus position and correcting a reference height and tilting of said measuring means on the basis of the measured height and tilting of said illumination detecting unit.

12. The reducing exposure apparatus claimed in claim 11, wherein said illumination detecting unit comprises a package including at least three photo-electric elements and a glass plate formed with at least three second patterns, said second pattern respectively corresponding in position to said photo-electric elements.

13. The reducing exposure apparatus claimed in claim 11, wherein said illumination detecting unit comprises a two dimensional array of optical sensors.

14. The reducing exposure apparatus claimed in claim 11, wherein said height and tilting measuring means comprises a light emitter and a photodetector for detecting a reflection of light so as to optically detect height and inclination of said substrate.

* * * * *